United States Patent [19]
Stuchly et al.

[11] 3,983,477
[45] Sept. 28, 1976

[54] DEVICE FOR MEASURING EXTRA HIGH VOLTAGE LINE CURRENT

[75] Inventors: Stanislaw Szczesny Stuchly, Winnipeg, Canada; Michael Napoleon Rzewuski, Warsaw, Poland; Michael Zenon Tarnawecky, Winnipeg, Canada

[73] Assignee: Manitoba Research Council, Winnipeg, Canada

[22] Filed: May 29, 1974

[21] Appl. No.: 474,168

[52] U.S. Cl. .............................. 324/117 R; 324/127
[51] Int. Cl.² ...................... G01R 19/00; G01R 19/26
[58] Field of Search ................ 324/117 R, 127, 96, 324/43 R; 332/29 M, 51 M, 51 R; 325/63, 67; 331/107 G

[56] References Cited
UNITED STATES PATENTS

| | | | |
|---|---|---|---|
| 2,836,791 | 5/1958 | Kaplan | 324/117 R |
| 3,102,243 | 8/1963 | Zaleski | 332/51 W |
| 3,235,819 | 2/1966 | Carvelas et al. | 332/51 R |
| 3,460,042 | 8/1969 | Harner | 325/63 |
| 3,546,624 | 12/1970 | Omori | 331/107 G |
| 3,569,835 | 3/1971 | Harner | 324/96 |

*Primary Examiner*—R. V. Rolinec
*Assistant Examiner*—Ernest F. Karlsen
*Attorney, Agent, or Firm*—Stanley G. Ade

[57] ABSTRACT

A ferromagnetic element tuned oscillator is located close to a current carrying conductor and is provided with a power supply energizing means. Means are provided for transmitting the information carried by the electro-magnetic wave from an extra high voltage potential tuned oscillator to a receiving means at ground level together with frequency measuring means. A frequency discriminator converts the received signal frequency variations into an output signal which is an analogue of the current flowing in the extra high voltage conductor. The output signal from the tuned oscillator can be transmitted either through free space or a dielectric wave guide, which provides the necessary isolation between the extra high voltage conductor and the receiver.

6 Claims, 2 Drawing Figures

DEVICE FOR MEASURING EXTRA HIGH VOLTAGE LINE CURRENT

BACKGROUND OF THE INVENTION:

This invention relates to new and useful improvements in devices and systems for measuring the current flowing in an electric conductor of an extra high voltage transmission line, and more particularly to a device for measuring, monitoring or sensing or alternating current in said transmission line.

Conventional and unconventional measuring techniques have been used in an attempt to measure the relatively high voltages and currents in extra high voltage transmission lines. However, these techniques have not been fully successful and difficulties are also encountered due to the relative inaccessibility of such lines under normal circumstances.

Furthermore, conventional current transformers do not give all of the correct information required and difficulties are encountered by misleading responses or malfunctions. Furthermore, is is difficult to compensate these devices for changing environmental factors which prejudice the accuracy of the measuring systems.

SUMMARY OF THE INVENTION:

The present invention overcomes these disadvantages by the provision of a ferromagnetic element capable of tuning an electrical oscillator as a quantitative function of the magnetic field in which it is located. The signal generated by the oscillator is transmitted to a receiver either through free air or by a dielectric wave guide and the signal so received is then modified so that it is displayed as an analogue of the current flowing in the extra high voltage transmission line adjacent the element.

The present invention is particularly designed for monitoring the current flow in an extra high voltage transmission line and it avoids, as far as possible, all of the major drawbacks in existing systems and in particular it provides high accuracy, wide response band with the resultant fast transient response and high fidelity of wave form reproduction, high temperature stability, smaller dimensions and weight, and a lower price.

Another object of the invention is to provide a device of the character herewithin described which enables additional information to be obtained as compared to that given by the conventional current transformers and to minimize unnecessary misleading responses or malfunctions and to compensate for changing environmental factors which would otherwise prejudice the accuracy of the measurement system.

A further object of the invention is to provide a current measuring device of the character herewithin described which avoids, as far as possible, fluctuation in response, when an extra high voltage transmission line is vibrating, for example, due to wind effect or the like.

Still another object of the invention is to provide a device of the character herewithin described by means of which the interfering magnetic effects of other nearby current conductors on the measurement of the wanted conductor, can be minimized.

In summary, there is provided a ferromagnetic tuned oscillator located close to the current carrying conductor, a power supply energizing means, for transmitting the information carried by the electro-magnetic wave from the extra high voltage potential ferromagnetic tuned oscillator, to the ground level, and a frequency measuring means.

With the foregoing objects in view, and other such objects and advantages as will become apparent to those skilled in the art to which this invention relates as this specification proceeds, our invention consists essentially in the arrangement and construction of parts all as hereinafter more particularly described, reference being had to the accompanying drawings in which:-

BRIEF DESCRIPTION OF THE DRAWINGS

In the drawings like characters of reference indicate corresponding parts in the different figures.

Figure 1:
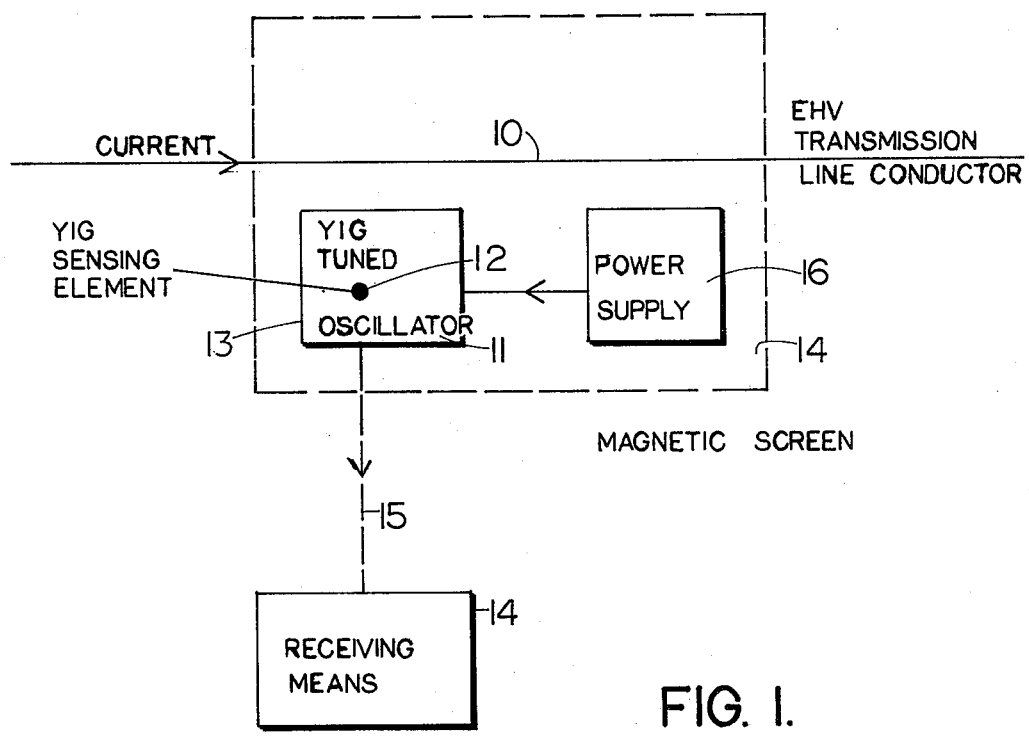
FIG. 1 shows an extra high voltage transmission line together with the tuned oscillator, power supply and receiving means in schematic form.

DETAILED DESCRIPTION:

Proceeding therefore to describe the invention in detail, reference character 10 illustrates an extra high voltage transmission line which is assumed to be carrying an A.C. current to be measured. This line may be operating at an extra high voltage of several hundred kilovolts and may be located in an inaccessible or exposed position carrying an extremely large current.

An oscillator 11 is located adjacent to the conductor or transmission line 10, and within the magnetic field created by the current flowing in the conductor 10.

A ferromagnetic element 12 is provided which is connected to the oscillator in a well-known manner so that it tunes the electrical oscillator as a quantitative function of the magnetic field in which it is located.

In the present embodiment, it is preferred that a single crystal yttrium-iron-garnett (YIG) is used as the ferromagnetic element because it has the narrowest ferromagnetic resonance line width known (about 0.2 oersteds with unloaded Q in the order of 10,000). This, together with its linear tuning in a varying magnetic field, makes YIG monocrystals ideally suited for tunable electric oscillators, and the combination enclosed within a rectangle in FIG. 1, is identified in the present application as a YIG-tuned oscillator 13.

The power supply and the YIG-tuned oscillator 13 is magnetically screened as shown schematically by reference character 14A.

The sensing element affects the frequency of the tuned oscillator reproducing the current flowing in the conductor 10.

The output signal of the YIG-tuned oscillator 13 is transmitted to a receiving means 14 which is at a lower potential than the extra high voltage transmission line conductor 10 and is most usually at ground potential.

The output signal from the YIG-tuned oscillator 13 can be transmitted to the receiving means 14 through either free space or by means of a dielectric wave guide, both of which are shown schematically by reference character 15. These provide the necessary isolation between the extra high voltage transmission line conductor 10 and the receiving means 14.

The power supply 16 is provided for the YIG-tuned oscillator 13 and can receive power either from the transmission line conductor 10 or by any other conventional means.

Figure 2:
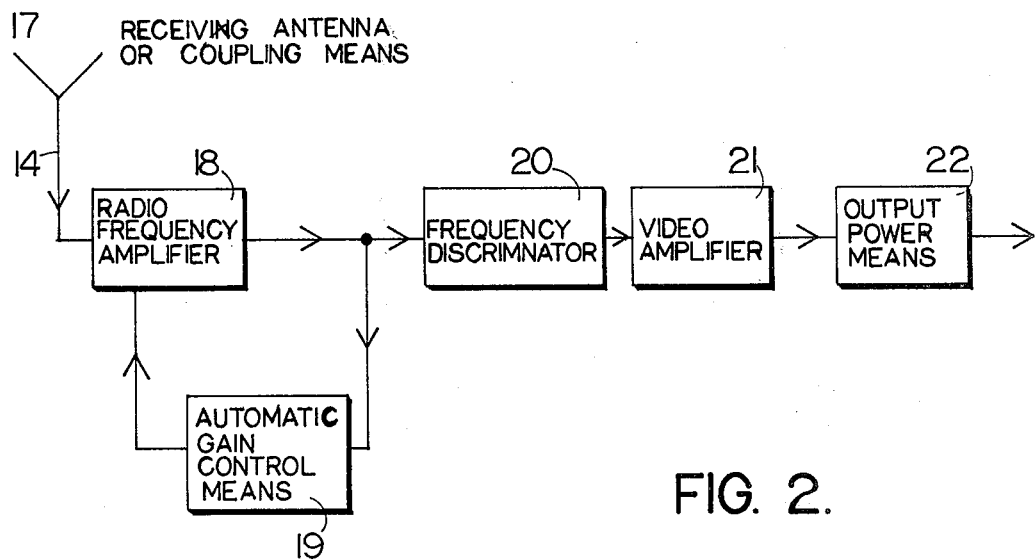
FIG. 2 shows a schematic block diagram of the receiving means.

The receiving means 14 converts the received signal to an output signal which is related to the current flowing in the extra high voltage transmission line conductor 10 and this receiving means is shown in FIG. 2 in block diagram form.

It contains a receiving antenna or coupling means 17 which is connected to a conventional radio frequency amplifier 18. Automatic gain control means 19 are connected as shown and are conventional in construction. The signal is connected to a frequency discriminator 20 and then through a video amplifier 21 to output power means 22, all of which are conventional.

The received signal from the antenna or coupling means 17 passes to the radio frequency amplifier 18 for amplification. The automatic gain control means 19 maintains a constant value of the signal at the input of the frequency discriminator 20 independently of the received signal power variations within a certain range.

The frequency discriminator 20 converts the received signal frequency variations into a signal, which is an analogue of the current flowing in the extra high voltage transmission line conductor 10. The frequency discriminator output signal is amplified by the video amplifier 21 and fed to the output power means 22.

Advantages of the present device and system over existing devices and systems include the fact that the device provides very good linearity and a wide dynamic range. Furthermore, this characteristic is not affected by temperature variations.

Another advantage of the device is the extremely light weight of the YIG-tuned oscillator 13 which makes it possible to attach same together with the power supply 16, directly to the extra high voltage transmission line conductor 10 without any additional mechanical structures to support this part of the system.

The band width of the system can be of the order of several megahertz, which together with a very good linearity, provides a high fidelity reproduction of the transmission line current wave form.

Another advantage of the device is that the transmission of information related to the extra high voltage transmission line current is accomplished using a frequency modulation means which is relatively insensitive to either extra high voltage transmission line mechanical vibration of attenuation variations along the propogation path between the YIG-tuned oscillator 13 and the receiving means 14. Furthermore, the information relative to the extra high voltage transmission line current is carried by a very high frequency signal which is relatively insensitive to radio frequency interference and environmental effects.

Since various modifications can be made in our invention as hereinabove described and many apparently widely different embodiments of same made within the spirit and scope of the claims without departing from such spirit and scope, it is intended that all matter contained in the accompanying specification shall be interpreted as illustrative only and not in a limiting sense.

What we claim as our invention is:

1. An electrical measuring device adapted to sense an electrical current flowing in a conductor of an extra high voltage electrical transmission line in a region of high potential, and to transmit a generated signal corresponding to said current, to receiving means in a region of relatively low potential in order to provide an output signal related to said electrical current; comprising in combination a single crystal yttrium-iron-garnett sensing element magnetically coupled to said extra high voltage transmission line in said region of high potential, an electrical oscillator, operatively connected to said sensing element whereby said sensing element tunes said oscillator, for generating a signal whose frequency is related to the current flowing in said extra high voltage transmission line, temperature compensated regulated power supply means in said region of high potential for operating said electrical oscillator, microwave transmission means operatively connected to said oscillator for transmitting the generated signal from said region of high potential, receiving means in said region of relatively low potential for receiving the signal from said transmission means, and means in said region of relatively low potential for converting said received signal into an output signal, which is related to the electrical current flowing in said extra high voltage transmission line.

2. The device according to claim 1 in which said microwave transmission means includes transmitting and receiving antennas.

3. The device according to claim 1 in which said electromagnetic wave transmission means includes a dielectric wave guide between said yttrium-iron-garnett tuned electrical oscialltor and said receiving means.

4. The device according to claim 1 in which said receiving means includes a radio frequency amplifier, an automatic gain control means, frequency discrimination means, a video amplifier and an output power means, all operatively connected together.

5. The device according to claim 2 in which said receiving means includes a radio frequency amplifier, an automatic gain control means, frequency discrimination means, a video amplifier and an output power means, all operatively connected together.

6. The device according to claim 3 in which said receiving means includes a radio frequency amplifier, an automatic gain control means, frequency discrimination means, a video amplifier and an output power means, all operatively connected together.

* * * * *